United States Patent
Setoyama et al.

(10) Patent No.: US 9,056,437 B2
(45) Date of Patent: Jun. 16, 2015

(54) SURFACE-COATED SINTERED BODY

(75) Inventors: Makoto Setoyama, Itami (JP); Katsumi Okamura, Itami (JP); Nozomi Tsukihara, Itami (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 157 days.

(21) Appl. No.: 13/877,372

(22) PCT Filed: Aug. 30, 2011

(86) PCT No.: PCT/JP2011/069546
§ 371 (c)(1),
(2), (4) Date: Apr. 2, 2013

(87) PCT Pub. No.: WO2012/070290
PCT Pub. Date: May 31, 2012

(65) Prior Publication Data
US 2013/0199351 A1    Aug. 8, 2013

(30) Foreign Application Priority Data
Nov. 26, 2010 (JP) .................. 2010-263550

(51) Int. Cl.
| | |
|---|---|
| B32B 5/16 | (2006.01) |
| B32B 9/04 | (2006.01) |
| C23C 30/00 | (2006.01) |
| B26D 1/00 | (2006.01) |
| C04B 41/90 | (2006.01) |
| C04B 41/00 | (2006.01) |
| C04B 41/52 | (2006.01) |
| C23C 14/02 | (2006.01) |
| C23C 14/06 | (2006.01) |
| C23C 14/32 | (2006.01) |
| C23C 14/34 | (2006.01) |
| C23C 14/54 | (2006.01) |
| C23C 14/58 | (2006.01) |
| C23C 28/00 | (2006.01) |
| C23C 28/04 | (2006.01) |

(52) U.S. Cl.
CPC ............ *B32B 9/041* (2013.01); *Y10T 428/265* (2015.01); *Y10T 156/10* (2015.01); *Y10T 428/256* (2015.01); *B23B 2226/125* (2013.01); *C23C 30/005* (2013.01); *B26D 1/0006* (2013.01); *B32B 5/16* (2013.01); *C04B 41/90* (2013.01); *C04B 41/009* (2013.01); *C04B 41/52* (2013.01); *C23C 14/022* (2013.01); *C23C 14/0664* (2013.01); *C23C 14/325* (2013.01); *C23C 14/34* (2013.01); *C23C 14/548* (2013.01); *C23C 14/5873* (2013.01); *C23C 28/347* (2013.01); *C23C 28/042* (2013.01); *C23C 28/044* (2013.01); *C23C 28/321* (2013.01); *B23B 2228/10* (2013.01)

(58) Field of Classification Search
USPC ............ 51/307, 309; 428/325, 336, 469, 472, 428/697, 698, 699, 704
See application file for complete search history.

(56) References Cited

U.S. PATENT DOCUMENTS

| | | | | |
|---|---|---|---|---|
| 4,381,198 A | * | 4/1983 | Kondo et al. | 106/1.12 |
| 5,853,873 A | * | 12/1998 | Kukino et al. | 428/699 |
| 6,296,928 B1 | | 10/2001 | Yamada et al. | |
| 6,506,481 B2 | * | 1/2003 | Makino et al. | 428/210 |
| 6,620,491 B2 | * | 9/2003 | Kukino et al. | 428/697 |
| 6,623,850 B2 | * | 9/2003 | Kukino et al. | 428/336 |
| 7,258,912 B2 | * | 8/2007 | Yamamoto et al. | 428/704 |
| 7,960,015 B2 | * | 6/2011 | Lechthaler et al. | 428/469 |
| 2002/0045072 A1 | | 4/2002 | Kukino et al. | |
| 2002/0048696 A1 | | 4/2002 | Kukino et al. | |
| 2005/0170162 A1 | | 8/2005 | Yamamoto et al. | |
| 2008/0193724 A1 | | 8/2008 | Okamura et al. | |
| 2008/0214383 A1 | | 9/2008 | Matsukawa et al. | |

FOREIGN PATENT DOCUMENTS

| | | |
|---|---|---|
| CN | 1906318 A | 1/2007 |
| CN | 1950165 A | 4/2007 |
| JP | 63-286575 A | 11/1988 |
| JP | 2000-129423 A | 5/2000 |
| JP | 2002-144110 A | 5/2002 |
| JP | 2002-144111 A | 5/2002 |
| JP | 2005-047004 A | 2/2005 |
| JP | 2005-213637 A | 8/2005 |
| JP | 2008-024976 A | 2/2008 |

OTHER PUBLICATIONS

International Search Report in International Application No. PCT/JP2011/069546 dated Oct. 25, 2011.
Notification of the First Office Action in Chinese Application No. 201180056084.5, dated Sep. 28, 2014.

* cited by examiner

*Primary Examiner* — Archene Turner
(74) *Attorney, Agent, or Firm* — Venable LLP; Michael A. Sartori; F. Brock Riggs

(57) ABSTRACT

A surface-coated sintered body includes a sintered body of cubic boron nitride (cBN) and a surface coating layer formed on a surface thereof, the sintered body of cBN containing 20 to 99.5% by volume of cBN and a binder, the surface coating layer including an adhesion layer and at least one hard coating layer, the adhesion layer being a metal layer containing at least W and being formed to cover a portion of the surface of the sintered body of cBN, the hard coating layer being formed to cover the sintered body of cBN and the adhesion layer, a ratio of cBN particles in contact with the adhesion layer to a total number of cBN particles in contact with the adhesion layer or the hard coating layer in the surface of the sintered body of cBN being 0.01 to 20%.

12 Claims, No Drawings

SURFACE-COATED SINTERED BODY

TECHNICAL FIELD

The present invention relates to a surface-coated sintered body including a sintered body of cubic boron nitride and a surface coating layer formed on a surface thereof.

BACKGROUND ART

Conventionally, a sintered body of cubic boron nitride has high hardness, and accordingly, it has been widely used as a material for tools such as cutting tools. Furthermore, it is also known to form a surface coating layer on a surface of a sintered body of cubic boron nitride for the purpose of improving wear resistance and the like.

For example, Japanese Patent Laying-Open No. 2005-047004 (Patent Literature 1) discloses a composite high-hardness material for a tool that is a sintered body of cubic boron nitride having a surface provided with an intermediate layer composed of a compound such as a nitride or a carbide of an element in group 4a, 5a, or 6a, and a coating such as TiAlN on the intermediate layer. Further, Japanese Patent Laying-Open No. 2002-144110 (Patent Literature 2) discloses a tool of a surface-coated sintered body of boron nitride that is formed of a sintered body of boron nitride having a surface provided with an intermediate layer composed of at least one element selected from group 4a, 5a, and 6a elements, and a hard coating layer on the intermediate layer. Furthermore, Japanese Patent Laying-Open No. 2000-129423 (Patent Literature 3) discloses a hard coating having a first layer composed of a metal in group 4a, 5a, or 6a formed on a substrate, and a second layer composed of TiAlVN or the like formed on the first layer.

CITATION LIST

Patent Literature

PTL 1: Japanese Patent Laying-Open No. 2005-047004
PTL 2: Japanese Patent Laying-Open No. 2002-144110
PTL 3: Japanese Patent Laying-Open No. 2000-129423

SUMMARY OF INVENTION

Technical Problem

When a hard coating layer is formed on a sintered body of cubic boron nitride, the hard coating layer tends to have poor toughness. In particular, when the hard coating layer receives a strong impact load or a varying load, the hard coating layer may exfoliate, which raises a problem of a shortened tool lifetime.

Therefore, it has been proposed to form an intermediate layer between a hard coating layer and a substrate (a sintered body of cubic boron nitride), and thereby improve adhesion of the hard coating layer to the substrate, as described in Patent Literatures 1 to 3.

However, in Patent Literature 1, although it is described that the intermediate layer composed of a compound such as a nitride or a carbide of an element in group 4a, 5a, or 6a improves adhesion when compared with the coating such as TiAlN (hard coating), further improvement in adhesion is required when a strong impact load or a varying load is exerted as described above. Further, in Patent Literature 2, since the intermediate layer is composed of a metal, rather than a compound as described in Patent Literature 1, this metal is diffused into both a sintered body of cubic boron nitride and a hard coating, and forms a solid solution such as a metal boride or a metal nitride in a portion having the metal diffused therein. Accordingly, adhesion further stronger than that of Patent Literature 1 can be expected. However, since such a solid solution tends to exhibit characteristics that the solid solution itself is hard and brittle, further improvement in adhesion is required when a strong impact load or a varying load is exerted as described above. On the other hand, Patent Literature 3 describes forming a metal layer as an intermediate layer, similarly as described in Patent Literature 2, for the purpose of alleviating stress. Such stress alleviation is expected to be effective when a hard coating has a high stress. If the hard coating itself has a low stress, however, such stress alleviation cannot be expected to be effective. Moreover, since the type of the substrate is not specified, it is unknown what effect is exhibited when a sintered body of cubic boron nitride is used as a substrate.

The present invention has been made in view of such circumstances, and one object of the present invention is to provide a surface-coated sintered body formed of a sintered body of cubic boron nitride having a surface coating layer formed thereon, the surface coating layer having sufficient adhesion even when the surface coating layer receives a strong impact load or a varying load.

Solution to Problem

The inventors of the present invention have diligently studied in order to overcome the above problem and as a result obtained the following finding. When a metal is used as an intermediate layer, it can be expected that the intermediate layer will mediate binding between a substrate and a hard coating layer or alleviate impact to some extent, and hence it can be expected that the intermediate layer will have an effect of enhancing adhesion between the substrate and the hard coating layer to some extent. However, the intermediate layer is easily destroyed by a strong impact load, and this may be caused in relation with the melting point of the metal and the configuration of the intermediate layer. Accordingly, the inventors of the present invention have studied metal types and the configuration of the intermediate layer in more detail based on this finding and as a result completed the present invention.

Specifically, a surface-coated sintered body of the present invention includes a sintered body of cubic boron nitride and a surface coating layer formed on a surface thereof, the sintered body of cubic boron nitride containing 20 to 99.5% by volume of cubic boron nitride and a binder, the surface coating layer including an adhesion layer and at least one hard coating layer, the adhesion layer being a metal layer containing at least W, and being formed to cover a portion of the surface of the sintered body of cubic boron nitride, the hard coating layer being formed to cover the sintered body of cubic boron nitride and the adhesion layer, a ratio of cubic boron nitride particles in contact with the adhesion layer to a total number of cubic boron nitride particles in contact with the adhesion layer or the hard coating layer in the surface of the sintered body of cubic boron nitride being 0.01 to 20%.

Herein, preferably, the adhesion layer is in an amorphous state or composed of ultrafine particles having an average particle size equal to or smaller than 5 nm, and contains W at 0.05 to 95 atomic %.

Preferably, the adhesion layer contains one or both of Ti and Cr at an atomic ratio of 0.1 to 3 relative to W, and preferably, the adhesion layer contains at least one element selected from the group consisting of Co, Ni, and Fe, at 0.1 to 20 atomic %. Further, preferably, the adhesion layer has a thickness of 0.5 to 30 nm.

Preferably, the hard coating layer has a stress of −1.5 to +0.5 GPa, and preferably, the hard coating layer includes a first coating layer as a lowermost layer in contact with the sintered body of cubic boron nitride and the adhesion layer, and the first coating layer is composed of a compound of: at least one element selected from the group consisting of group IVa elements (Ti, Zr, Hf, and the like), group Va elements (V, Nb, Ta, and the like), and group VIa elements (Cr, Mo, W, and the like) in a periodic table of elements, Al, and Si; and at least one element selected from the group consisting of boron, carbon, nitrogen, and oxygen.

Preferably, the first coating layer is composed of at least one compound selected from the group consisting of TiAlN, AlCrN, and TiSiN, or a solid solution containing the compound, or composed of a super-multilayer laminate having the compound or the solid solution as a constituent layer. Further, preferably, the first coating layer has a region within 20 nm from its interface with the adhesion layer, that is composed of columnar crystals having particle sizes of 1 to 20 nm. Furthermore, preferably, the hard coating layer of the present invention has a thickness of 0.5 to 20 μm.

In addition, the present invention also relates to a cutting tool formed by bonding a surface-coated sintered body as described above to a cutting edge portion of a substrate made of cemented carbide.

Advantageous Effects of Invention

The surface-coated sintered body of the present invention having the above configuration has a significantly excellent effect of providing excellent adhesion between a sintered body of cubic boron nitride and a surface coating layer.

DESCRIPTION OF EMBODIMENTS

Hereinafter, the present invention will be described in more detail.

<Surface-Coated Sintered Body>

A surface-coated sintered body of the present invention includes a sintered body of cubic boron nitride and a surface coating layer formed on a surface thereof. The surface-coated sintered body of the present invention may have the surface coating layer formed to cover the surface of the sintered body of cubic boron nitride entirely or partially. In particular, when the surface-coated sintered body is bonded to a substrate and thus used as will be described later, it is unnecessary that the surface-coated sintered body at a portion thereof bonded to the substrate has the surface coating layer formed thereon.

<Sintered Body of Cubic Boron Nitride>

The sintered body of cubic boron nitride of the present invention contains 20 to 99.5% by volume of cubic boron nitride and a binder. As long as the sintered body of cubic boron nitride of the present invention contains these two components, the sintered body of cubic boron nitride may contain any other component including an inevitable impurity.

Further, the sintered body of cubic boron nitride of the present invention is composed of a number of cubic boron nitride particles, and the binder has an effect to bind the cubic boron nitride particles. Such a binder is not limited in particular, and the one having such a composition as described below can be selected.

Composition 1: a compound of: at least one element selected from the group consisting of group IVa elements, group Va elements, and group VIa elements in a periodic table of elements, Al, and Si; and at least one element selected from the group consisting of boron, carbon, nitrogen, and oxygen;

Composition 2: a solid solution containing the above compound;

Composition 3: a metal simple substance such as Co, W, Ni, Al or the like;

Composition 4: a compound containing Co, W, Ni, Al, and/or the like;

Composition 5: a solid solution containing the compound of composition 1 and Co, W, Ni, Al and/or the like; and Composition 6: the compound of composition 1 further containing Co, W, Ni, Al, and/or the like.

Such a binder will be contained in the sintered body of cubic boron nitride normally in an amount accounting for the remainder other than the cubic boron nitride.

A sintered body of cubic boron nitride is normally composed of cubic boron nitride particles having an average particle size of approximately 0.2 to 10 μm. If the particle size has distribution, however, then it is preferable to provide particles with large particle size to be closer to a surface (i.e., on a side in contact with the surface coating layer), since this allows the sintered body to more firmly adhere to an adhesion layer described later.

It is noted that the average particle size of the cubic boron nitride particles can be measured by observing a cross section of the sintered body with an optical microscope or a scanning electron microscope (SEM).

<Surface Coating Layer>

The surface coating layer of the present invention includes an adhesion layer and one or more hard coating layers. As long as the surface coating layer includes these layers, the surface coating layer may include any other layer.

The surface coating layer of the present invention is configured such that initially the adhesion layer is formed to cover a portion of the surface of the sintered body of cubic boron nitride, and then the hard coating layer covers the adhesion layer and the sintered body of cubic boron nitride at a portion uncovered with the adhesion layer.

Such a surface coating layer is formed mainly for the purpose of improving the wear resistance of the sintered body of cubic boron nitride. Hereinafter, each layer will be described.

<Adhesion Layer>

The adhesion layer of the present invention is a metal layer containing at least W, and is formed to cover a portion of the surface of the sintered body of cubic boron nitride. The present invention is characterized in that the ratio of cubic boron nitride particles in contact with the adhesion layer to the total number of cubic boron nitride particles in contact with the adhesion layer or the hard coating layer in the surface of the sintered body of cubic boron nitride is 0.01 to 20%, more preferably 0.02 to 1%. With the adhesion layer configured as described above, the surface-coated sintered body of the present invention has heat resistance, strength, and toughness to a high degree, and thus exhibits an excellent effect of allowing the sintered body of cubic boron nitride and the surface coating layer to significantly firmly adhere to each other.

Herein, the "metal layer" means that the main component constituting the layer is a metal simple substance, and the "surface of the sintered body of cubic boron nitride" includes a portion of the sintered body of cubic boron nitride if a component of the surface coating layer has been diffused into that portion.

The adhesion layer contains W, which is a metallic material having a relatively high melting point, and accordingly softens to a limited extent even when high temperature is applied to the surface-coated sintered body (e.g., when the surface-coated sintered body is used for a cutting tool, high temperature is applied to a cutting edge portion thereof and the like during cutting). Further, W is highly adhesive to cubic boron nitride particles constituting the sintered body of cubic boron nitride, and is also highly adhesive to the hard coating layer. The adhesion layer which at least contains W allows the surface coating layer to have a significantly excellent toughness. It is believed that W exhibits such an excellent effect because W is capable of forming a chemical bond with covalent and electrically insulating cubic boron nitride and is also capable of forming a chemical bond with a metal-binding and electrically conductive hard coating layer.

Since the cubic boron nitride and the hard coating layer are both hard ceramics, an interface in which the cubic boron nitride and the hard coating layer are in contact with each other has a high strength, but is destroyed brittlely when it is deformed by a high load. Further, an interface between the cubic boron nitride and the adhesion layer exhibits a tendency that its strength is reduced rapidly at high temperature. Accordingly, it is anticipated that, when high temperature is applied to the surface-coated sintered body (e.g., if the surface-coated sintered body is used for a cutting tool, high temperature is applied to a cutting edge portion thereof during cutting), an interface between cubic boron nitride particles and the surface coating layer is destroyed and exfoliates upon receiving a strong impact load or a periodic or aperiodic repetitive load (varying load), resulting in low adhesion.

However, this anticipation is based on a case where the surface of the sintered body of cubic boron nitride is continuously covered with either the adhesion layer or the hard coating layer, and an effect totally different from this anticipation has been able to be obtained by adopting a configuration as in the present invention. Specifically, significantly firm adhesion between the sintered body of cubic boron nitride and the surface coating layer has been successfully obtained by configuring the surface coating layer such that initially the adhesion layer is formed to cover a portion of the surface of the sintered body of cubic boron nitride, and then the hard coating layer covers the adhesion layer and the sintered body of cubic boron nitride at a portion uncovered with the adhesion layer, and by adopting the configuration that the ratio of cubic boron nitride particles in contact with the adhesion layer to the total number of cubic boron nitride particles in contact with the adhesion layer or the hard coating layer in the surface of the sintered body of cubic boron nitride is 0.01 to 20%.

Namely, an interface having high strength and excellent toughness even at high temperature can be produced by causing both the interface in which cubic boron nitride particles and the hard coating layer are directly bonded with each other and which is strong and highly heat-resistant and the interface in which cubic boron nitride particles and the adhesion layer are directly bonded with each other and which has excellent toughness to be present at a specific ratio as described above. It is considered that such an excellent effect is exhibited probably because mainly the former interface withstands a high load and the latter interface absorbs deformation. It is also estimated that presence of two types of interfaces as described above suppresses crack growth at a boundary between different interfaces, and thus prevents exfoliation of the surface coating layer due to crack growth, resulting in increased adhesion between the sintered body of cubic boron nitride and the surface coating layer.

It is noted that, if the ratio of cubic boron nitride particles in contact with the adhesion layer to the total number of cubic boron nitride particles in contact with the adhesion layer or the hard coating layer in the surface of the sintered body of cubic boron nitride is less than 0.01%, the surface-coated sintered body cannot absorb deformation of the interface and has poor toughness, and if the above ratio is more than 20%, the surface-coated sintered body has poor heat resistance and strength.

<State of Adhesion Layer>

Preferably, the adhesion layer of the present invention is in an amorphous state or composed of ultrafine particles having an average particle size equal to or smaller than 5 nm. More preferably, the adhesion layer of the present invention has a mixed phase thereof.

Normally, materials different in binding properties or electrical conductivity cannot have a chemical bond directly formed therebetween, and their interface has poor adhesion. Mixing may be done to allow such materials to have an interface with their elements mixed together to form a compound, and in the present invention, a boride or a nitroboride of a metal component contained in the surface coating layer will be formed as such a compound. However, such a boride or a nitroboride is a brittle material, and in addition a covalent and electrically insulating material or a metal-binding and electrically conductive material is formed in the end. Thus, it is believed that the interface cannot have essentially improved adhesion.

In contrast, the adhesion layer of the present invention contains W, which is a metal-binding and electrically conductive metal, and is one of elements having the largest number of electrons among transition metals. Accordingly, W can assume various electron arrangements, and it is believed that there is a possibility that W also forms a chemical bond with a covalent material. The study by the inventors of the present invention has clarified that the adhesion layer (W in particular) that is in an amorphous state or composed of ultrafine particles having an average particle size equal to or smaller than 5 nm assumes a specific electronic structure and thus produces a covalent component and a metal-binding component, and can form a strong chemical bond with both the cubic boron nitride as a covalent material and the metal-binding and electrically conductive hard coating layer.

It is noted that an average particle size exceeding 5 nm results in only the surfaces of particles having the above electronic structure, which in turn results in a reduction in the ratio of the above described suitable state to the entire adhesion layer, resulting in a major portion of normal, metal-binding W. This reduces density of chemical bond with the cubic boron nitride. On the other hand, average particle sizes having smaller values are preferable, and accordingly, it is not necessary to define a lower limit value therefor in particular. However, an average particle size of less than 0.5 nm is essentially undistinguishable from the amorphous state.

It is noted that, while W may be partially mixed with the cubic boron nitride, the primary phase is preferably W metal which is in an amorphous state or composed of the above described ultrafine particles.

The adhesion layer having the above state is improved in strength, hardness, toughness, and similar mechanical characteristics, and thus is also excellent in particular in this regard.

However, if the adhesion layer is entirely amorphous, it has a uniform structure and may thus have poor strength. If the adhesion layer is entirely composed only of the above described ultrafine particles, a gap may result at a particle boundary of the ultrafine particles, and the adhesion layer may have poor strength and toughness. Accordingly, an adhesion layer having a mixed phase of an amorphous state and ultrafine particles is particularly preferable, and the adhesion layer thus has an amorphous phase filling gaps between ultrafine particles, or has ultrafine particles present in a base phase of the amorphous phase, to be an adhesion layer excellent in strength and toughness in particular.

Further, by forming the adhesion layer to have a portion closer to the sintered body of cubic boron nitride that has an amorphous state more, the adhesion layer achieves more excellent adhesion.

It is noted that such a state of the adhesion layer can be determined by measuring transmission electron diffraction of the adhesion layer with a transmission electron microscope (TEM)/energy dispersive X-ray spectrometry (EDS). In this case, when a transmission electron diffraction image includes a halo component, it indicates that an amorphous state (an amorphous phase) exists. When a diffraction pattern exists, it indicates that ultrafine particles are contained. When both are observed, they indicate a mixed phase of the both. Particle sizes of the ultrafine particles can be confirmed in a TEM image of high magnification, and their average particle size can be obtained by measuring particle sizes of 10 or more such particles and averaging them.

<Composition of Adhesion Layer>

Preferably, the adhesion layer of the present invention contains W at 0.05 to 95 atomic %, because containing W allows the adhesion layer to obtain such an excellent effect as described above. The adhesion layer containing W at less than 0.05 atomic % may not obtain the above excellent effect sufficiently. Further, the effect of W is promoted by mixing a small amount of a different element, and accordingly, 95 atomic % or less is preferable. Examples of the different element can include oxygen, carbon, nitrogen, boron, and similar light elements; group IVa elements, group Va elements, group VIa elements, and similar transition metals; Co, Fe, Ni, and similar iron group metals; and Y, Al, Si, and the like. It is noted that, if W has a content exceeding 95 atomic %, W may crystallize and tend to be coarse particles inconveniently. A more preferable content of W is 5 to 70 atomic %.

Further, the adhesion layer preferably contains one or both of Ti and Cr at an atomic ratio of 0.1 to 3, more preferably 0.8 to 2.5, relative to W. When Ti and Cr are both contained, their total atomic ratio shall fall within the above range.

One or both of Ti and Cr contained at the above atomic ratio provides/provide improved mechanical characteristics. It is noted that, if the above atomic ratio is less than 0.1, such improved mechanical characteristics may not be obtained, and an atomic ratio exceeding 3 may result in a hard and brittle adhesion layer and hence inconveniently poor mechanical characteristics.

Furthermore, the adhesion layer of the present invention preferably contains at least one element selected from the group consisting of Co, Ni and Fe, at 0.1 to 20 atomic %, more preferably 1 to 10 atomic %. When two or more of these elements are contained, it is preferable that their total falls within the above range.

Adding at least one element selected from the group consisting of Co, Ni, and Fe allows W to provide a chemical bond more densely, and provides improved mechanical characteristics. This is because the adhesion layer can more effectively have the above described amorphous state or ultrafine particle structure, and a covalent component can be increased. Examples of the improved mechanical characteristics can include, in particular, improved toughness of the adhesion layer and suppressed exfoliation of the adhesion layer due to fatigue fracture thereof.

It is noted that, if the above content is less than 0.1 atomic %, the above described effect cannot be obtained, and if the above content exceeds 20 atomic %, the characteristics of W may be lost.

Such a composition of the adhesion layer can be identified with a transmission electron microscope (TEM)/energy dispersive X-ray spectrometry (EDS).

<Thickness of Adhesion Layer>

Preferably, the adhesion layer has a thickness of 0.5 to 30 nm. The adhesion layer having a thickness in this range can have high strength and be significantly adhesive to (or have high affinity for) both the cubic boron nitride and the hard coating layer. More preferably, the adhesion layer has a thickness of 2 to 20 nm.

The adhesion layer having a thickness of less than 0.5 nm may not be able to obtain the above described effect. The adhesion layer having a thickness exceeding 30 nm has W as a metal dominant in strength, and thus the interface with the cubic boron nitride may have a reduced strength.

Such a thickness of the adhesion layer can be identified with a transmission electron microscope (TEM)/energy dispersive X-ray spectrometry (EDS).

<Hard Coating Layer>

The surface coating layer of the present invention includes one or more hard coating layers formed to cover the sintered body of cubic boron nitride (at a portion not having the adhesion layer formed thereon) and the adhesion layer. Preferably, the hard coating layer has a stress of −1.5 to +0.5 GPa, more preferably −1 to 0 GPa.

Herein, stress indicated by a numerical value with the sign "+" indicates tensile stress, and stress indicated by a numerical value with the sign "−" indicates compressive stress. Such a stress can be measured for example by the $\sin^2\psi$ method or the like.

If the hard coating layer has a stress exceeding 0.5 GPa, the hard coating layer is extremely decreased in strength and toughness, and when it is used as a cutting tool, the cutting edge of the tool may have a reduced chipping property (or wear resistance). Further, if the stress is less than −1.5 GPa, the hard coating layer is self-destroyed, chips and exfoliates, and may no longer be able to improve wear resistance (or may reduce the adhesion with the sintered body of cubic boron nitride).

Preferably, such a hard coating layer is composed of one or more layers, and, as one layer thereof, includes a first coating layer, as will be described later. Preferably, such a hard coating layer is composed of a compound of: at least one element selected from the group consisting of group IVa elements, group Va elements, and group VIa elements in the periodic table of elements, Al, and Si; and at least one element selected from the group consisting of boron, carbon, nitrogen, and oxygen. This can provide excellent wear resistance.

Further, preferably, the hard coating layer of the present invention has a thickness of 0.5 to 20 μm, more preferably 0.75 to 7 μm. If the hard coating layer has a thickness of less than 0.5 μm, the hard coating layer may not be able to exhibit sufficient wear resistance, whereas if the hard coating layer has a thickness exceeding the hard coating layer exhibits a tendency to chip and exfoliate.

<First Coating Layer>

Preferably, the hard coating layer of the present invention includes a first coating layer as a lowermost layer in contact with the sintered body of cubic boron nitride and the adhesion layer, and the first coating layer is composed of a compound of: at least one element selected from the group consisting of group IVa elements (Ti, Zr, Hf, and the like), group Va elements (V, Nb, Ta, and the like), and group VIa elements (Cr, Mo, W, and the like) in the periodic table of elements, Al, and Si; and at least one element selected from the group consisting of boron, carbon, nitrogen, and oxygen. Examples of such a compound can include TiN, TiCN, TiB$_2$, TiAlN, AlCrN, TiSiN, and the like. It is noted that, in the present invention, when the compound is expressed by a chemical formula such as TiCN, it shall include any conventionally known atomic ratios and does not indicate Ti, C, and N having an atomic ratio of 1:1:1, unless otherwise indicated.

In particular, preferably, the first coating layer is composed of at least one compound selected from the group consisting of TiAlN, AlCrN, and TiSiN, or a solid solution containing the compound, or composed of a super-multilayer laminate having the compound or the solid solution as a constituent layer.

The first coating layer having a configuration as described above can be extremely increased in hardness, and thus have mechanical characteristics matched with those of the adhesion layer and those of the sintered body of cubic boron nitride and obtain high adhesion to them. Such a first coating layer will be an electrically conductive and metal-binding coating, and when the first coating layer has a composition containing a nitride of Al or a carbide/nitride of Si and a solid solution thereof, these compounds partially include a covalent bond. Accordingly, as the adhesion layer of the present invention includes both a covalent bond and a metal-binding bond, the first coating layer and the adhesion layer have a stronger chemical bond, and extremely high adhesion can thus be obtained.

On the other hand, when the first coating layer is composed of a super-multilayer laminate, several initial layers formed on the adhesion layer are affected by the adhesion layer and change into an electronic structure which more easily forms a chemical bond, and can thus achieve further increased adhesion to the adhesion layer. It is noted that the super-multilayer laminate refers to a laminate of approximately 10 to 5000 nanometer layers each composed of the above compound or solid solution and having approximately 0.5 to 20 nm. More preferably, it is suitable that two or more of the above constituent layers are laminated repeatedly.

Further, preferably, the first coating layer has a region within 20 nm from its interface with the adhesion layer (i.e., a region in a thickness direction) that is composed of columnar crystals having particle sizes of 1 to 20 nm. The first coating layer can thus have excellent structural consistency with the adhesion layer and hence provide further increased adhesion.

Herein, the particle size of a columnar crystal means its diameter. Being columnar crystals can be confirmed through high-resolution SEM or TEM observation, and their particle sizes can also be confirmed through TEM observation.

<Application>

While the surface-coated sintered body of the present invention can also be used alone, it can for example be bonded to a substrate composed of cemented carbide or the like to be used as a cutting tool or the like. In particular, the present invention is suitable for use as a cutting tool formed by bonding a surface-coated sintered body to a cutting edge portion of a substrate made of cemented carbide.

Herein, preferably, the above cemented carbide contains at least WC and Co.

<Manufacturing Method>

The sintered body of cubic boron nitride of the present invention can be obtained through a conventionally known manufacturing method such as ultra-high-pressure sintering. Further, the surface coating layer can be formed on the sintered body of cubic boron nitride, for example as follows.

Specifically, the adhesion layer can be formed by forming a metal constituting the adhesion layer on the sintered body of cubic boron nitride by sputtering, and thereafter partially removing the metal by etching. The adhesion layer can also be formed directly on the sintered body of cubic boron nitride by increasing a bias voltage for the sputtering (in this case, film deposition and etching are simultaneously performed).

On the other hand, the hard coating layer can be formed by arc discharge-type ion plating or sputtering. When arc discharge-type ion plating is employed, the hard coating layer can be formed by using a metal evaporation source of a type of metal that will constitute the hard coating layer, and a reactive gas such as CH$_4$, N$_2$, O$_2$, or the like, and adopting conventionally known conditions. When sputtering is employed, the hard coating layer can be formed by using a metal evaporation source of a type of metal that will constitute the hard coating layer, a reactive gas such as CH$_4$, N$_2$, O$_2$, or the like, and a sputtering gas such as Ar, Kr, Xe, He, Ne, or the like, and adopting conventionally known conditions.

The surface-coated sintered body of the present invention can thus be manufactured. When the surface-coated sintered body is bonded for example to a substrate made of cemented carbide to obtain a cutting tool, it can be manufactured as follows.

Initially, a substrate made of cemented carbide can be manufactured by conventionally known sintering and molding methods. Then, the surface-coated sintered body is bonded to an appropriate portion of the substrate by a known bonding method, using a known brazing material, and thus a cutting tool can be manufactured.

EXAMPLES

Hereinafter, examples will be referred to describe the present invention in more detail. However, the present invention is not limited thereto. It is noted that, in the following description, a hard coating layer shall indicate a first coating layer, unless otherwise indicated.

Examples 1 to 7 and Comparative Examples 1 to 2

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 μm and an angle of 25°) (this will be hereinafter referred to as a tool of the sintered body).

The sintered body of cubic boron nitride was produced so as to contain cubic boron nitride at a ratio (in % by volume) as shown in the following Table 1 by mixing together powdery cubic boron nitride and a powdery raw material for a binder (with Ti used so that the binder's composition was TiN and TiB$_2$), and by sintering the mixture at 1450° C. and 5.5 GPa. (It is noted that the powdery raw material was blended at a ratio that reflects a composition ratio of the sintered body of cubic boron nitride, unless otherwise indicated, and this also applies to each of the following examples.)

The tool of the sintered body was introduced into a film deposition apparatus and the apparatus was then vacuumed, and thereafter the tool of the sintered body was heated to 500° C. and Ar ions were used to etch it. Subsequently, an adhesion layer was formed on the sintered body of cubic boron nitride in the film deposition apparatus. The adhesion layer was formed as follows: a target having a composition containing 25 atomic % of W, 50 atomic % of Cr, 12.5 atomic % of Co, and 12.5 atomic % of Fe was prepared, and while Ar was introduced, sputtering was performed at 1 Pa and a sputtering electric power of 5 kW for a period of time until a layer with a thickness of 20 nm was obtained.

Thereafter, Ar ions were used to etch the adhesion layer to have a thickness of 1 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. This adjustment can be performed by adjusting the thickness of the adhesion layer formed beforehand by sputtering and the amount of etching with Ar ions. It is noted that the temperature during the sputtering was adjusted to 300° C. to provide the adhesion layer in an amorphous state.

Subsequently, a hard coating layer was formed on the adhesion layer and on the sintered body of cubic boron nitride at a portion not having the adhesion layer formed thereon, by arc discharge-type ion plating. The hard coating layer had a composition of $Ti_{0.9}Si_{0.1}N$, and an evaporation source prepared to provide the coating composition served as a cathode to perform cold-cathode arc discharge to provide evaporation and ionization, and this was continued for a period of time until a thickness of 2 μm was attained, to form a hard coating layer of $Ti_{0.9}Si_{0.1}N$. It is noted that a bias voltage adjusted to −30 V, a pressure adjusted to 3.5 Pa, and the substrate's temperature adjusted to 600° C. allowed the hard coating layer to have a stress of −1.1 GPa, and have a region within 20 nm from its interface with the adhesion layer, composed of columnar crystals having a particle size of 2 nm.

Thus, the cutting tools of examples 1 to 7 and those of comparative examples 1 to 2 were produced.

Examples 101 to 109

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 μm and an angle of 25°) (this will be hereinafter referred to as a tool of the sintered body).

The sintered body of cubic boron nitride was produced so as to contain 92% by volume of cubic boron nitride by mixing together powdery cubic boron nitride and a powdery raw material for a binder (with W, Co, B, and C used so that the binder's composition was a carbide of W, W, a carbide or a boride of Co, and a solid solution of W—Co), and by sintering the mixture at 1500° C. and 5.5 GPa.

The tool of the sintered body was introduced into a film deposition apparatus and the apparatus was then vacuumed, and thereafter the tool of the sintered body was heated to 500° C. and Ar ions were used to etch it. Subsequently, an adhesion layer was formed on the sintered body of cubic boron nitride in the film deposition apparatus. The adhesion layer was formed as follows: a target of W and a target containing Al and Si at a composition ratio of 2:1 were prepared, and while Ar was introduced, sputtering was performed at 1 Pa and a sputtering electric power of 0.1 to 10 kW for each target, adjusted to achieve a composition in Table 2, for a period of time until a layer with a thickness of 30 nm was obtained. It is noted, however, that, for the adhesion layer in example 109, sputtering was performed using only the target of W at 5 kW.

Thereafter, Kr ions were used to etch the adhesion layer to have a thickness of 2 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. This adjustment can be performed by adjusting Kr gas flow rate, bias voltage, the degree of vacuum, and the substrate's temperature. It is noted that the temperature during the sputtering was adjusted to 350° C.

Subsequently, a hard coating layer was formed on the adhesion layer and on the sintered body of cubic boron nitride at a portion not having the adhesion layer formed thereon, by arc discharge-type ion plating. The hard coating layer had a composition of $Ti_{0.65}Cr_{0.2}Al_{0.1}Si_{0.05}N$, and an evaporation source prepared to provide the coating composition served as a cathode to perform cold-cathode arc discharge to provide evaporation and ionization, and this was continued for a period of time until a thickness of 1.1 μm was attained, to form a hard coating layer of $Ti_{0.65}Cr_{0.2}Al_{0.1}Si_{0.5}N$. It is noted that the substrate's temperature adjusted to 600° C., a pressure adjusted to 4 Pa, and a bias voltage adjusted to −30 V allowed the hard coating layer to have a stress of −0.5 GPa. Further, setting the substrate's temperature in an early stage of film deposition at 500° C. provided the hard coating layer having a region within 20 nm from its interface with the adhesion layer, composed of columnar crystals having a particle size of 4 nm.

Thus, the cutting tools of examples 101 to 109 were produced. The adhesion layers in examples 101 to 108 were formed of ultrafine particles having an average particle size of 2 nm, whereas the adhesion layer in example 109 was formed of coarse particles in the state of crystals having a particle size of 10 nm.

Examples 201 to 207

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 μm and an angle of 25°) (this will be hereinafter referred to as a tool of the sintered body).

The sintered body of cubic boron nitride was produced so as to contain 70% by volume of cubic boron nitride by mixing together powdery cubic boron nitride and a powdery raw material for a binder (with Ti and Al used so that the binder's composition was TiCN, $TiB_2$, AlN, and $AlB_2$), and by sintering the mixture at 1400° C. and 5.0 GPa.

The tool of the sintered body was introduced into a film deposition apparatus and the apparatus was then vacuumed, and thereafter the tool of the sintered body was heated to 620° C. and Xe ions were used to etch it. Subsequently, an adhesion layer was formed on the sintered body of cubic boron nitride in the film deposition apparatus. The adhesion layer was formed as follows: a target containing W, Co, Ni, and Cr at an atomic composition of W:Co:Ni:Cr=5:4:4:X1 (with X1 varied as shown in Table 3) was prepared, and while Ar was introduced, sputtering was performed at 1 Pa and a sputtering electric power of 5 kW for a period of time until a layer with a thickness of 50 nm was obtained.

Thereafter, Cr ions were used to etch the adhesion layer to have a thickness of 10 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. On this occasion, etching was performed at an arc current of 100 A, a pressure of 1 Pa with Ar being introduced, and a bias voltage of 600 V. This adjustment can further be performed by adjusting the arc current of a Cr evaporation source, the bias voltage, the degree of vacuum, gas types ($N_2$, Ar) and the ratio thereof. It is noted that the temperature during the sputtering was adjusted to 300° C. to compose the adhesion layer having a mixed phase of an amorphous state and ultrafine particles having an average particle size of 1 nm.

Subsequently, a hard coating layer was formed on the adhesion layer and on the sintered body of cubic boron nitride at a portion not having the adhesion layer formed thereon, by arc discharge-type ion plating. The hard coating layer had a composition of $Ti_{0.5}Al_{0.5}N$, and an evaporation source prepared to provide the coating composition served as a cathode to perform cold-cathode arc discharge to provide evaporation and ionization, and this was continued for a period of time until a thickness of 3 μm was attained, to form a hard coating layer of $Ti_{0.5}Al_{0.5}N$. It is noted that the hard coating layer had a stress of −1 GPa. Further, setting the substrate's temperature in an early stage of film deposition at 500° C. provided the hard coating layer having a region within 20 nm from its interface with the adhesion layer, composed of columnar crystals having a particle size of 4 nm.

Thus, the cutting tools of examples 201 to 207 were produced.

Examples 301 to 307

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 μm and an angle of 25°) (this will be hereinafter referred to as a tool of the sintered body).

The sintered body of cubic boron nitride was produced so as to contain 50% by volume of cubic boron nitride by mixing together powdery cubic boron nitride and a powdery raw material for a binder (with Ti, W, and C used so that the binder's composition was TiWN, WC, and $TiB_2$), and by sintering the mixture at 1350° C. and 5.5 GPa.

The tool of the sintered body was introduced into a film deposition apparatus and the apparatus was then vacuumed, and thereafter the tool of the sintered body was heated to 620° C. and Xe ions were used to etch it. Subsequently, an adhesion layer was formed on the sintered body of cubic boron nitride in the film deposition apparatus. The adhesion layer was formed as follows: a target containing W, Ti, Cr, and Co at an atomic composition of W:Ti:Cr:Co=60:9:9:X2 (with X2 varied as shown in Table 4) was prepared, and while Ar was introduced, sputtering was performed at 1 Pa and a sputtering electric power of 5 kW for a period of time until a layer with a thickness of 35 nm was obtained.

Thereafter, Cr ions were used to etch the adhesion layer to have a thickness of 7 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. This adjustment can be performed by adjusting the arc current of a Cr evaporation source, the bias voltage, the degree of vacuum, gas types ($N_2$, Ar) and the ratio thereof. It is noted that the temperature during the sputtering was adjusted to 350° C. to compose the adhesion layer having a mixed phase of an amorphous state and ultrafine particles having an average particle size of 3 nm.

Subsequently, a hard coating layer was formed on the adhesion layer and on the sintered body of cubic boron nitride at a portion not having the adhesion layer formed thereon, by arc discharge-type ion plating. The hard coating layer had a composition of $Al_{0.7}Cr_{0.23}Si_{0.07}N$, and an evaporation source prepared to provide the coating composition served as a cathode to perform cold-cathode arc discharge to provide evaporation and ionization, and this was continued for a period of time until a thickness of 1.8 μm was attained, to form a hard coating layer of $Al_{0.7}Cr_{0.23}Si_{0.07}N$. It is noted that the hard coating layer had a stress of −1.3 GPa. Further, setting the substrate's temperature in an early stage of film deposition at 600° C. provided the hard coating layer having a region within 20 nm from its interface with the adhesion layer, composed of columnar crystals having a particle size of 1.5 nm.

Thus, the cutting tools of examples 301 to 307 were produced.

Examples 401 to 409

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 μm and an angle of 25°) (this will be hereinafter referred to as a tool of the sintered body).

The sintered body of cubic boron nitride was produced so as to contain 60% by volume of cubic boron nitride by mixing together powdery cubic boron nitride and a powdery raw material for a binder (with Ti, Hf, and Al used so that the binder's composition was TiHfCN, $TiB_2$, $HfB_2$, AlN, and $AlB_2$), and by sintering the mixture at 1400° C. and 5.5 GPa.

The tool of the sintered body was introduced into a film deposition apparatus and the apparatus was then vacuumed, and thereafter the tool of the sintered body was heated to 620° C. and Xe ions were used to etch it. Subsequently, an adhesion layer was formed on the sintered body of cubic boron nitride in the film deposition apparatus. The adhesion layer was formed as follows: a target having a composition of 53 atomic % of W, 5 atomic % of Cr, and 42 atomic % of Co was prepared, and while Ar was introduced, sputtering was performed at 1 Pa and a sputtering electric power of 5 kW, for a period of time adjusted to obtain a layer with a thickness of 1.5 to 180 nm.

Thereafter, Cr ions were used to etch the adhesion layer to have a thickness as shown in Table 5, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. This adjustment can be performed by adjusting the arc current of a Cr evaporation source, the bias voltage, the degree of vacuum, gas types ($N_2$, Ar) and the ratio thereof. It is noted that the temperature during the sputtering was adjusted to 350° C. to compose the adhesion layer having a mixed phase of an amorphous state and ultrafine particles having an average particle size of 0.7 nm.

Subsequently, a hard coating layer was formed on the adhesion layer and on the sintered body of cubic boron nitride at a portion not having the adhesion layer formed thereon, by arc discharge-type ion plating. The hard coating layer had a composition of a super-multilayer laminate having $Ti_{0.4}Al_{0.6}N$ and $Al_{0.6}Cr_{0.3}Si_{0.1}N$ laminated on one another alternately, each by 50 layers, and was produced by simultaneously discharging two types of evaporation sources of $Ti_{0.4}Al_{0.6}$ and $Al_{0.6}Cr_{0.3}Si_{0.1}$ and rotating the tool of the sintered body to pass between the evaporation sources. The film deposition time continued until the hard coating layer attained a thickness of 1 μm. It is noted that, by applying as a bias voltage a pulse bias varied from −50 V to +15 V at 50 kHz, the hard coating layer had a stress of +0.4 GPa. Further, setting the substrate's temperature in an early stage of film deposition at 550° C. provided the hard coating layer having a region within 20 nm from its interface with the adhesion layer, composed of columnar crystals having a particle size of 2 nm.

Thus, the cutting tools of examples 401 to 409 were produced.

Examples 501 to 507

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 μm and an angle of 25°) (this will be hereinafter referred to as a tool of the sintered body).

The sintered body of cubic boron nitride was produced so as to contain 85% by volume of cubic boron nitride by mixing together powdery cubic boron nitride and a powdery raw material for a binder (with Ti, Al, and Zr used so that the binder's composition was TiCN, $TiB_2$, AlN, $AlB_2$, and $ZrO_2$), and by sintering the mixture at 1450° C. and 5.5 GPa.

The tool of the sintered body was introduced into a film deposition apparatus and the apparatus was then vacuumed, and thereafter the tool of the sintered body was heated to 620° C. and Xe ions were used to etch it. Subsequently, an adhesion layer was formed on the sintered body of cubic boron nitride in the film deposition apparatus. The adhesion layer was formed to have a composition of 33.3 atomic % of W, 33.3 atomic % of Cr, and 33.3 atomic % of Co by vapor-depositing W and Co through sputtering and by simultaneously vapor-depositing Cr through arc discharge-type ion plating. The formation time continued until the adhesion layer attained a thickness of 40 nm.

Thereafter, Cr ions were used to etch the adhesion layer to have a thickness of 9 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. This adjustment can be performed by adjusting the arc current of a Cr evaporation source, the bias voltage, the degree of vacuum, gas types ($N_2$, Ar) and the ratio thereof. It is noted that the sputtering and the arc discharge-type ion plating were performed with the substrate's temperature adjusted to 350° C. to 650° C. and a bias voltage adjusted to −50 V to −500 V to vary the state of the adhesion layer as shown in Table 6.

Subsequently, a hard coating layer was formed on the adhesion layer and on the sintered body of cubic boron nitride at a portion not having the adhesion layer formed thereon, by arc discharge-type ion plating. The hard coating layer had a composition of $Al_{0.65}Ti_{0.3}Si_{0.05}C_{0.05}N_{0.95}$, and an evaporation source prepared to provide the coating composition served as a cathode to perform cold-cathode arc discharge to provide evaporation and ionization, and this was continued for a period of time until a thickness of 4.5 μm was attained, to form a hard coating layer of $Al_{0.65}Ti_{0.3}Si_{0.05}C_{0.05}N_{0.95}$. It is noted that, by applying as a bias voltage a pulse bias varied from −50 V to 0 V at 50 kHz, the hard coating layer had a stress of −0.2 GPa. Further, setting the substrate's temperature in an early stage of film deposition at 250 to 550° C. provided the hard coating layer having a region within 20 nm from its interface with the adhesion layer, composed of columnar crystals having a particle size of 1.5 nm.

Thus, the cutting tools of examples 501 to 507 were produced.

Examples 601 to 605 and Comparative Examples 601 to 602

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 µm and an angle of 25°) (this will be hereinafter referred to as a tool of the sintered body).

The sintered body of cubic boron nitride was produced so as to contain 95% by volume of cubic boron nitride by mixing together powdery cubic boron nitride and a powdery raw material for a binder (with W, Co, B, and C used so that the binder's composition was compounds of W, Co, B, and C such as WC and $WCoB_2$), and by sintering the mixture at 1450° C. and 6.0 GPa.

The tool of the sintered body was introduced into a film deposition apparatus and the apparatus was then vacuumed, and thereafter the tool of the sintered body was heated to 620° C. and Xe ions were used to etch it. Subsequently, an adhesion layer was formed on the sintered body of cubic boron nitride in the film deposition apparatus. The adhesion layer was formed to have a composition of 29 atomic % of W, 58 atomic % of Cr, and 13 atomic % of Co by forming W and Co through sputtering and by forming Cr through arc discharge-type ion plating. The formation time continued until the adhesion layer attained a thickness of 75 nm.

Thereafter, Cr ions were used to etch the adhesion layer to have a thickness of 15 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be as shown in Table 7, by adjusting conditions for etching to provide an arc current of 50 A, a pressure of 1 Pa with Ar and $N_2$ being introduced at a ratio of 9:1, and a bias voltage of 300 to 900 V. It is noted that the sputtering and the arc discharge-type ion plating were simultaneously performed to compose the adhesion layer having a mixed phase of an amorphous state and ultrafine particles having an average particle size of 0.6 nm.

Subsequently, a hard coating layer was formed on the adhesion layer and on the sintered body of cubic boron nitride at a portion not having the adhesion layer formed thereon, by arc discharge-type ion plating. The hard coating layer had a composition of $Al_{0.7}Ti_{0.3}N$, and an evaporation source prepared to provide the coating composition served as a cathode to perform cold-cathode arc discharge to provide evaporation and ionization, and this was continued for a period of time until a thickness of 4 µm was attained, to form a hard coating layer of $Al_{0.7}Ti_{0.3}N$. It is noted that, by applying as a bias voltage a pulse bias varied from −20 V to 0 V at 50 kHz, the hard coating layer had a stress of ±0 GPa. Further, setting the substrate's temperature in an early stage of film deposition at 600° C. provided the hard coating layer having a region within 20 nm from its interface with the adhesion layer, composed of columnar crystals having a particle size of 15 nm.

Thus, the cutting tools of examples 601 to 605 and those of comparative examples 601 to 602 were produced.

Examples 701 to 707

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 µm and an angle of 25°) (this will be hereinafter referred to as a tool of the sintered body).

The sintered body of cubic boron nitride was produced so as to contain 45% by volume of cubic boron nitride by mixing together powdery cubic boron nitride and a powdery raw material for a binder (with Ti, Zr, and Al used so that the binder's composition was TiZrCN and $Al_2O_3$), and by sintering the mixture at 1350° C. and 5.5 GPa.

The tool of the sintered body was introduced into a film deposition apparatus and the apparatus was then vacuumed, and thereafter the tool of the sintered body was heated to 620° C. and Xe ions were used to etch it. Subsequently, an adhesion layer was formed on the sintered body of cubic boron nitride in the film deposition apparatus. The adhesion layer was formed as follows: a target having a composition of 70 atomic % of W and 30 atomic % of Fe was prepared, and while Ar was introduced, sputtering was performed at 1 Pa and a sputtering electric power of 5 kW for a period of time until a layer with a thickness of 70 nm was obtained.

Thereafter, Cr ions were used to etch the adhesion layer to have a thickness of 15 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. This adjustment can be performed by adjusting the arc current of a Cr evaporation source, the bias voltage, the degree of vacuum, gas types ($N_2$, Ar) and the ratio thereof. It is noted that the temperature during the sputtering was adjusted to 400° C. to compose the adhesion layer having a mixed phase of an amorphous state and ultrafine particles having an average particle size of 4.5 nm.

Subsequently, a hard coating layer was formed on the adhesion layer and on the sintered body of cubic boron nitride at a portion not having the adhesion layer formed thereon, by arc discharge-type ion plating. The hard coating layer had a composition of a super-multilayer laminate having $Ti_{0.93}Si_{0.07}N$ and $Ti_{0.5}Al_{0.3}Cr_{0.1}Si_{0.1}N$ laminated on one another alternately, each by 1050 layers, and was produced by simultaneously discharging two types of evaporation sources prepared such that the two layers constituting the coating layer would have compositions of $Ti_{0.93}Si_{0.07}N$ and $Ti_{0.5}Al_{0.3}Cr_{0.1}Si_{0.1}N$, respectively, and rotating the tool of the sintered body to pass between the evaporation sources. The film deposition time continued until the hard coating layer attained a thickness of 6.3 μm. It is noted that, by applying as a bias voltage a pulse bias varied from +20 V, +10 V, −10 V, −25 V, −50 V, −80 V, −100 V to 0 V at 50 kHz, the hard coating layer had a stress varied as shown in Table 8. Further, setting the substrate's temperature in an early stage of film deposition at 600° C. provided the hard coating layer having a region within 20 nm from its interface with the adhesion layer, composed of columnar crystals having a particle size of 3 nm.

Thus, the cutting tools of examples 701 to 707 were produced.

Examples 801 to 807

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 μm and an angle of 25°) (this will be hereinafter referred to as a tool of the sintered body).

The sintered body of cubic boron nitride was produced so as to contain 98% by volume of cubic boron nitride by mixing together powdery cubic boron nitride and a powdery raw material for a binder (with Al used so that the binder's composition was Al, AlN, and $AlB_2$), and by sintering the mixture at 1450° C. and 6.0 GPa.

The tool of the sintered body was introduced into a film deposition apparatus and the apparatus was then vacuumed, and thereafter the tool of the sintered body was heated to 620° C. and Xe ions were used to etch it. Subsequently, an adhesion layer was formed on the sintered body of cubic boron nitride in the film deposition apparatus. The adhesion layer was formed as follows: a target having a composition containing 90 atomic % of W and 10 atomic % of Ti was prepared, and while Ar was introduced, sputtering was performed at 1 Pa and a sputtering electric power of 5 kW for a period of time until a layer with a thickness of 100 nm was obtained.

Thereafter, Cr ions were used to etch the adhesion layer to have a thickness of 22 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. This adjustment can be performed by adjusting the arc current of a Cr evaporation source, the bias voltage, the degree of vacuum, gas types ($N_2$, Ar) and the ratio thereof. It is noted that the temperature during the sputtering was adjusted to 300° C. to compose the adhesion layer in an amorphous state.

Subsequently, a hard coating layer was formed on the adhesion layer and on the sintered body of cubic boron nitride at a portion not having the adhesion layer formed thereon, by arc discharge-type ion plating. The hard coating layer had a composition of $Al_{0.8}Cr_{0.2}N$, and an evaporation source prepared to provide the coating composition served as a cathode to perform cold-cathode arc discharge to provide evaporation and ionization, for a period of time adjusted to attain a thickness indicated in Table 9, to form a hard coating layer of $Al_{0.8}Cr_{0.2}N$. It is noted that, by applying as a bias voltage a pulse bias varied from −50 V to +30 V at 50 kHz, the hard coating layer had a stress of −0.2 GPa. Further, setting the substrate's temperature in an early stage of film deposition at 600° C. provided the hard coating layer having a region within 20 nm from its interface with the adhesion layer, composed of columnar crystals having a particle size of 18 nm.

Thus, the cutting tools of examples 801 to 807 were produced.

Examples 901 to 906

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 μm and an angle of 25°) (this will be hereinafter referred to as a tool of the sintered body).

The sintered body of cubic boron nitride was produced so as to contain 65% by volume of cubic boron nitride by mixing together powdery cubic boron nitride and a powdery raw material for a binder (with Ti and Al used so that the binder's composition was TiC, TiCN, $TiB_2$, AlN, and $AlB_2$), and by sintering the mixture at 1350° C. and 6.0 GPa.

The tool of the sintered body was introduced into a film deposition apparatus and the apparatus was then vacuumed, and thereafter the tool of the sintered body was heated to 620° C. and Xe ions were used to etch it. Subsequently, an adhesion layer was formed on the sintered body of cubic boron nitride in the film deposition apparatus. The adhesion layer was formed as follows: a target having a composition containing 76 atomic % of W, 8 atomic % of Co, 8 atomic % of Ni, and 8 atomic % of Fe was prepared, and while Ar was introduced, sputtering was performed at 1 Pa and a sputtering electric power of 5 kW; and subsequently, a bias voltage of −750 V was applied to the tool of the sintered body to evaporate Ti by arc discharge-type ion plating and mixing was performed, to form an adhesion layer of 45 atomic % of W, 40 atomic % of Ti, 5 atomic % of Co, 5 atomic % of Ni, and 5 atomic % of Fe, with a thickness of 35 nm.

Thereafter, Cr ions were used to etch the adhesion layer to have a thickness of 7 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. This adjustment can be performed by adjusting the arc current of a Cr evaporation source, the bias voltage, the degree of vacuum, gas types ($N_2$, Ar) and the ratio thereof. It is noted that the temperature during the sputtering was adjusted to 380° C. to compose the adhesion layer having a mixed phase of an amorphous state and ultrafine particles having an average particle size of 1.8 nm.

Subsequently, a hard coating layer was formed on the adhesion layer and on the sintered body of cubic boron nitride at a portion not having the adhesion layer formed thereon, by arc discharge-type ion plating. The hard coating layer had a composition of a super-multilayer laminate having $Al_{0.7}Cr_{0.3}N$ and $Ti_{0.5}Al_{0.4}Si_{0.1}N$ laminated on one another alternately, each by 800 layers, and was produced by simultaneously discharging two types of evaporation sources prepared such that the two layers constituting the coating layer would have compositions of $Al_{0.7}Cr_{0.3}N$ and $Ti_{0.5}Al_{0.4}Si_{0.1}N$, respectively, and rotating the tool of the sintered body to pass between the evaporation sources. The film deposition time continued until the hard coating layer attained a thickness of 8 μm. It is noted that, by applying as a bias voltage a pulse bias varied from −25 V to 0 V at 50 kHz, the hard coating layer had a stress of +1.4 GPa. Further, setting the substrate's temperature in an early stage of film deposition at 300 to 600° C. provided the hard coating layer having a region within 20 nm from its interface with the adhesion layer, composed of columnar crystals having a particle size varied as shown in Table 10.

Thus, the cutting tools of examples 901 to 906 were produced.

Example 1001

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 μm and an angle of 25°) (this will be hereinafter referred to as a tool of the sintered body).

The sintered body of cubic boron nitride was produced so as to contain 65% by volume of cubic boron nitride by mixing together powdery cubic boron nitride and a powdery raw material for a binder (with $TiAl_2N$ and W used so that the binder's composition was TiCN, $TiB_2$, AlN, $AlB_2$, and WC), and by sintering the mixture at 1300° C. and 6.0 GPa.

The tool of the sintered body was introduced into a film deposition apparatus and the apparatus was then vacuumed, and thereafter the tool of the sintered body was heated to 620° C. and Xe ions were used to etch it. Subsequently, an adhesion layer was formed on the sintered body of cubic boron nitride in the film deposition apparatus. The adhesion layer was formed as follows: a target having a composition of 40 atomic % of W, 40 atomic % of Cr, and 20 atomic % of Co was prepared, and while Ar was introduced, sputtering was performed at 1 Pa and a sputtering electric power of 5 kW for a period of time adjusted to obtain a layer with a thickness of 60 nm.

Thereafter, Cr ions were used to etch the adhesion layer to have a thickness of 11 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. This adjustment can be performed by adjusting the arc current of a Cr evaporation source, the bias voltage, the degree of vacuum, gas types ($N_2$, Ar) and the ratio thereof. It is noted that the temperature during the sputtering was adjusted to 350° C. to compose the adhesion layer having a mixed phase of an amorphous state and ultrafine particles having an average particle size of 1.1 nm.

Subsequently, a hard coating layer was formed on the adhesion layer and on the sintered body of cubic boron nitride at a portion not having the adhesion layer formed thereon, by arc discharge-type ion plating. The hard coating layer was composed of a first coating layer of TiN having a thickness of 0.3 μm, and a layer of $Ti_{0.5}Al_{0.5}N$ having a thickness of 2.7 μm formed on the first coating layer (hereinafter referred to as a "second coating layer"). Specifically, an evaporation source prepared to provide such a coating composition served as a cathode to perform cold-cathode arc discharge to provide evaporation and ionization, and the film deposition time was adjusted to attain the above thickness. It is noted that, by applying as a bias voltage a pulse bias varied from −50 V to 0 V at 50 kHz, the hard coating layer had a stress of −0.6 GPa. Further, setting the substrate's temperature in an early stage of film deposition at 600° C. provided the first coating layer having a region within 20 nm from its interface with the adhesion layer, composed of columnar crystals having a particle size of 1.5 nm.

Thus, the cutting tool of example 1001 was produced.

Example 1002

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 μm and an angle of 25°) (this will be hereinafter referred to as a tool of the sintered body).

The sintered body of cubic boron nitride was produced so as to contain 50% by volume of cubic boron nitride by mixing together powdery cubic boron nitride and a powdery raw material for a binder (with Ti, Al, and W used so that the binder's composition was TiCN, $TiB_2$, AlN, $AlB_2$, and WC), and by sintering the mixture at 1300° C. and 6 GPa.

The tool of the sintered body was introduced into a film deposition apparatus and the apparatus was then vacuumed, and thereafter the tool of the sintered body was heated to 620° C. and Xe ions were used to etch it. Subsequently, an adhesion layer was formed on the sintered body of cubic boron nitride in the film deposition apparatus. The adhesion layer was formed as follows: a target having a composition of 45 atomic % of W, 32 atomic % of Ti, and 23 atomic % of Co was prepared, and while Ar was introduced, sputtering was performed at 1 Pa and a sputtering electric power of 5 kW for a period of time adjusted to obtain a layer with a thickness of 40 nm.

Thereafter, Cr ions were used to etch the adhesion layer to have a thickness of 8 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. This adjustment can be performed by adjusting the arc current of a Cr evaporation source, the bias voltage, the degree of vacuum, gas types ($N_2$, Ar) and the ratio thereof. It is noted that the temperature during the sputtering was adjusted to 400° C. to compose the adhesion layer having a mixed phase of an amorphous state and ultrafine particles having an average particle size of 1.2 nm.

Subsequently, a hard coating layer was formed on the adhesion layer and on the sintered body of cubic boron nitride at a portion not having the adhesion layer formed thereon, by arc discharge-type ion plating. The hard coating layer was composed of a first coating layer of $Ti_{0.2}Al_{0.7}Si_{0.1}N$ having a thickness of 0.7 µm, and a layer of $Ti_{0.92}Si_{0.08}C_{0.2}N_{0.8}$ having a thickness of 1.3 µm formed on the first coating layer (hereinafter referred to as a "second coating layer"). Specifically, an evaporation source prepared to provide such a coating composition served as a cathode to perform cold-cathode arc discharge to provide evaporation and ionization, and the film deposition time was adjusted to attain the above thickness. It is noted that, by applying as a bias voltage a pulse bias varied from −60 V to 0 V at 50 kHz, the hard coating layer had a stress of −0.4 GPa. Further, setting the substrate's temperature in an early stage of film deposition at 600° C. provided the first coating layer having a region within 20 nm from its interface with the adhesion layer, composed of columnar crystals having a particle size of 1.2 nm.

Thus, the cutting tool of example 1002 was produced.

Example 1003

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 µm and an angle of 25°) (this will be hereinafter referred to as a tool of the sintered body).

The sintered body of cubic boron nitride was produced so as to contain 42% by volume of cubic boron nitride by mixing together powdery cubic boron nitride and a powdery raw material for a binder (with TiN, AlN, and W used so that the binder's composition was TiCN, $TiB_2$, AlN, $AlB_2$, and WC), and by sintering the mixture at 1300° C. and 5.0 GPa.

The tool of the sintered body was introduced into a film deposition apparatus and the apparatus was then vacuumed, and thereafter the tool of the sintered body was heated to 620° C. and Xe ions were used to etch it. Subsequently, an adhesion layer was formed on the sintered body of cubic boron nitride in the film deposition apparatus. The adhesion layer was formed as follows: a target having a composition of 85 atomic % of W and 15 atomic % of Ni was prepared, and while Ar was introduced, sputtering was performed at 1 Pa and a sputtering electric power of 5 kW for a period of time adjusted to obtain a layer with a thickness of 30 nm.

Thereafter, Cr ions were used to etch the adhesion layer to have a thickness of 6 nm, and thereby the ratio of coverage by the adhesion layer was adjusted as follows. Specifically, the ratio of coverage by the adhesion layer was adjusted such that the ratio of cubic boron nitride particles in contact with the adhesion layer to the total number of cubic boron nitride particles in contact with the adhesion layer or the hard coating layer in the surface of the sintered body of cubic boron nitride would be 15%. This adjustment can be performed by adjusting the arc current of a Cr evaporation source, the bias voltage, the degree of vacuum, gas types ($N_2$, Ar) and the ratio thereof. It is noted that the temperature during the sputtering was adjusted to 450° C. to compose the adhesion layer having a mixed phase of an amorphous state and ultrafine particles having an average particle size of 1.3 nm.

Subsequently, a hard coating layer was formed on the adhesion layer and on the sintered body of cubic boron nitride at a portion not having the adhesion layer formed thereon, by arc discharge-type ion plating. The hard coating layer was composed of a first coating layer of $Ti_{0.7}Zr_{0.1}Si_{0.2}N$ having a thickness of 0.5 µm, and a layer having a thickness of 1 µm as a super-multilayer laminate formed by alternately laminating $Ti_{0.7}Zr_{0.1}Si_{0.2}N$ and $Al_{0.7}Ti_{0.3}N$, each by 25 layers, formed on the first coating layer (hereinafter referred to as a "second coating layer"). Specifically, the first coating layer was produced as follows: an evaporation source prepared to provide such a coating composition served as a cathode to perform cold-cathode arc discharge to provide evaporation and ionization, and the film deposition time was adjusted to attain the above thickness. The second coating layer was produced by simultaneously discharging two types of evaporation sources of $Ti_{0.7}Zr_{0.1}Si_{0.2}$ and $Al_{0.7}Ti_{0.3}$ and rotating the tool of the sintered body to pass between the evaporation sources. It is noted that, by applying as a bias voltage a pulse bias varied from −50 V to 0 V at 50 kHz, the hard coating layer had a stress of −1.2 GPa. Further, setting the substrate's temperature in an early stage of film deposition at 600° C. provided the first coating layer having a region within 20 nm from its interface with the adhesion layer, composed of columnar crystals having a particle size of 1.4 nm.

Thus, the cutting tool of example 1003 was produced.

Comparative Example 1001

A surface-coated sintered body was bonded to a cutting edge portion of a substrate made of cemented carbide to produce a cutting tool.

As the substrate made of cemented carbide, cemented carbide (corresponding to K10) which was ISO CNMA120408 in shape was prepared, and its cutting edge portion (or corner portion) had a sintered body of cubic boron nitride produced as will be described later (shape: a triangular prism which had a base in the form of an isosceles triangle having a vertex angle of 80° and two sides sandwiching the vertex angle and each having a length of 2 mm, and had a thickness of 2 mm) bonded thereto with a brazing material of Ti—Zr—Cu, and the bonded body then had its periphery and upper and lower surfaces ground to provide the cutting edge with a negative-land (having a width of 150 μm and an angle of 25°) (this will be hereinafter referred to as a tool of the sintered body).

The sintered body of cubic boron nitride was produced so as to contain 40% by volume of cubic boron nitride by mixing together powdery cubic boron nitride and a powdery raw material for a binder (with Ti, Al, and W used so that the binder's composition was TiCN, $TiB_2$, AlN, $AlB_2$, and WC), and by sintering the mixture at 1350° C. and 5 GPa.

The tool of the sintered body was introduced into a film deposition apparatus and the apparatus was then vacuumed, and thereafter the tool of the sintered body was heated to 620° C. and Xe ions were used to etch it. Subsequently, no adhesion layer was formed on the sintered body of cubic boron nitride in the film deposition apparatus, and a hard coating layer was directly formed thereon by arc discharge-type ion plating. The hard coating layer was composed as a layer of $Ti_{0.5}Al_{0.5}N$ having a thickness of 3 μm. Specifically, an evaporation source prepared to provide such a coating composition served as a cathode to perform cold-cathode arc discharge to provide evaporation and ionization, and the film deposition time was adjusted to attain the above thickness. It is noted that, by applying as a bias voltage a pulse bias varied from –70 V to 0 V at 50 kHz, the hard coating layer had a stress of –1 GPa. Further, setting the substrate's temperature in an early stage of film deposition at 600° C. provided the hard coating layer having a region within 20 nm from its interface with the substrate, composed of columnar crystals having a particle size of 10 nm.

Thus, the cutting tool of comparative example 1001 was produced.

<Measurement Conditions>

Numerical values in the above examples and comparative examples were measured as described below.

<Measurement of Surface Coating Layer>

The state (or structure) of the adhesion layer including its thickness, composition, crystallinity, and its ultrafine particles' average particle size were evaluated through measurement as follows: specifically, a cross section including the sintered body of cubic boron nitride and the surface coating layer was initially formed by the focused ion beam (FIB) method. Then, in the cross section, an interface between the sintered body of cubic boron nitride and the adhesion layer was observed with a scanning transmission electron microscope (STEM)/energy dispersive X-ray spectrometry (EDS).

Then, "observation of a STEM image of the cross section" was used to measure the "thickness" of the adhesion layer, particle sizes of the ultrafine particles if they are formed, and particle sizes of columnar crystals in the hard coating layer (the first coating layer) at a region within 20 nm from its interface with the adhesion layer. Further, "EDS analysis" was used to evaluate the composition, and "electron diffraction" was used to evaluate the crystallinity. Furthermore, the thickness, composition, and the like of the hard coating layer were also obtained similarly as in the adhesion layer.

It is noted that the EDS analysis was done with a sample processed with an ion beam to be approximately 100 nm in thickness, the STEM's electron beam diameter set at 1 nmϕ, and the magnification for observation set at 100000 times or more. In this case, the electron beam was incident at an angle adjusted such that contrast of the adhesion layer or contrast of W would be maximized as compared with another metallic element component (including a metallic element constituting the hard coating layer), B, and the like.

Further, the adhesion layer has unevenness, and when the composition of the adhesion layer is observed, an element of the hard coating layer or an element of the sintered body of cubic boron nitride may be detected. Furthermore, when the adhesion layer or the hard coating layer is formed, the energy of species of film deposited can be controlled to mix the adhesion layer and the sintered body of cubic boron nitride or the hard coating layer, and this also results in such an analysis result as above. A result detected in such a case was also included as a composition of the adhesion layer.

<Ratio of Coverage by Adhesion Layer>

The ratio of cubic boron nitride particles in contact with the adhesion layer to the total number of cubic boron nitride particles in contact with the adhesion layer or the hard coating layer in the surface of the sintered body of cubic boron nitride was measured as described below.

Specifically, a cross section including the sintered body of cubic boron nitride and the surface coating layer formed as described above was initially processed with an ion beam to be flat. Then, for the flattened cross section, a high-resolution scanning electron microscope (SEM) was used to observe an interface between cubic boron nitride particles and the surface coating layer, and EDS was used to count the number of cubic boron nitride particles having W detected in the interface and the number of cubic boron nitride particles not having W detected in the interface. Thus, the above ratio was obtained.

It is noted that the SEM shows a composition in an image such that a W-containing adhesion layer is observed as a layer having a particularly high lightness, and accordingly, the adhesion layer can be determined simply from whether this bright layer exists or not.

<Evaluation Method>

The cutting tools of the examples and comparative examples obtained as described above were used under the following cutting conditions to perform two types of cutting tests. Cutting test A can mainly evaluate the hard coating layer's adhesion, wear resistance, and damage resulting from accumulated chipping, and cutting test B can evaluate the hard coating layer's adhesion, wear resistance, and anti-chipping property against relatively large chipping. The tests both indicate, as a tool lifetime, a period of time elapsing before flank wear (Vb) attains 0.2 mm (i.e., a cutting time), and longer cutting time indicates better adhesion between the sintered body of cubic boron nitride and the surface coating layer (i.e., excellence in both wear resistance and toughness). Results are shown in Tables 1 to 11. It is noted that in the tables, the term "exfoliated/chipped" indicates that the surface coating layer exfoliated or a cutting tool chipped during a cutting test, and thus cutting time was unmeasurable.

<Cutting Test A (Light Interrupted Test)>
Cutting speed: V=170 m/min
Feed: f=0.1 mm/rev
Cut: d=0.2 mm
Wet type/dry type: Dry type
Workpiece: SCM435 carburizing material (HRC62) in the form of a round bar with one groove and as heat-treated skin <Cutting Test B (Heavy Interrupted Test)>
Cutting speed: V=200 m/min
Feed: f=0.05 mm/rev
Cut: d=0.2 mm
Wet type/dry type: Dry type
Workpiece: SUJ2 (HRC60) in the form of a round bar having longitudinally extending six grooves

TABLE 1

| | Content of Cubic Boron Nitride (% by volume) | Cutting Test A (minutes) | Cutting Test B (minutes) |
|---|---|---|---|
| Comparative Example 1 | 10 | 13 | 17 |
| Example 1 | 26 | 25 | 21 |
| Example 2 | 46 | 33 | 28 |
| Example 3 | 62 | 39 | 35 |
| Example 4 | 72 | 45 | 41 |
| Example 5 | 82 | 30 | 35 |
| Example 6 | 86 | 26 | 28 |
| Example 7 | 96 | 19 | 23 |
| Comparative Example 2 | 99.9 | 15 | exfoliated/chipped |

TABLE 2

| | Content of W (atomic %) | Cutting Test A (minutes) | Cutting Test B (minutes) |
|---|---|---|---|
| Example 101 | 0.02 | 20 | 22 |
| Example 102 | 0.1 | 25 | 29 |
| Example 103 | 5 | 30 | 36 |
| Example 104 | 20 | 39 | 40 |
| Example 105 | 46 | 33 | 34 |
| Example 106 | 65 | 31 | 28 |
| Example 107 | 88 | 26 | 23 |
| Example 108 | 95 | 20 | 16 |
| Example 109 | 99.5 | exfoliated/chipped | exfoliated/chipped |

TABLE 3

| | Content of Cr (atomic ratio relative to W) | Cutting Test A (minutes) | Cutting Test B (minutes) |
|---|---|---|---|
| Example 201 | 0.02 | 24 | 16 |
| Example 202 | 0.15 | 39 | 30 |
| Example 203 | 0.6 | 46 | 35 |
| Example 204 | 1 | 53 | 45 |
| Example 205 | 1.2 | 51 | 48 |
| Example 206 | 2.8 | 38 | 33 |
| Example 207 | 3.5 | 24 | 17 |

TABLE 4

| | Content of Co (atomic %) | Cutting Test A (minutes) | Cutting Test B (minutes) |
|---|---|---|---|
| Example 301 | 0.05 | 26 | 16 |
| Example 302 | 0.2 | 39 | 42 |
| Example 303 | 3 | 51 | 48 |
| Example 304 | 7 | 44 | 33 |
| Example 305 | 12 | 37 | 29 |
| Example 306 | 17 | 27 | 23 |
| Example 307 | 22 | 17 | 16 |

TABLE 5

| | Thickness of Adhesion Layer (nm) | Cutting Test A (minutes) | Cutting Test B (minutes) |
|---|---|---|---|
| Example 401 | 0.25 | 15 | 18 |
| Example 402 | 0.6 | 25 | 26 |
| Example 403 | 1.5 | 35 | 34 |
| Example 404 | 6 | 42 | 39 |
| Example 405 | 12 | 52 | 45 |
| Example 406 | 18 | 39 | 41 |
| Example 407 | 22 | 27 | 36 |
| Example 408 | 27 | 18 | 24 |
| Example 409 | 35 | 13 | 17 |

TABLE 6

| | State of Adhesion Layer | Cutting Test A (minutes) | Cutting Test B (minutes) |
|---|---|---|---|
| Example 501 | amorphous | 31 | 22 |
| Example 502 | amorphous & ultrafine particles (0.7) | 44 | 36 |
| Example 503 | amorphous & ultrafine particles (1.2) | 46 | 42 |
| Example 504 | amorphous & ultrafine particles (2.5) | 46 | 39 |
| Example 505 | amorphous & ultrafine particles (3.2) | 38 | 38 |
| Example 506 | amorphous & ultrafine particles (4.8) | 33 | 33 |
| Example 507 | amorphous & ultrafine particles (15) | 24 | 22 |

In the above table, "amorphous" indicates that the adhesion layer has an amorphous state, and "amorphous & ultrafine particles" indicates that the adhesion layer has a mixed phase of an amorphous state and ultrafine particles. A parenthesized numerical value indicates an average particle size (nm) of ultrafine particles.

TABLE 7

| | Ratio of Cubic Boron Nitride Particles in Contact with Adhesion Layer (%) | Cutting Test A (minutes) | Cutting Test B (minutes) |
|---|---|---|---|
| Comparative Example 601 | 0.005 | 17 | exfoliated/chipped |
| Example 601 | 0.02 | 39 | 28 |
| Example 602 | 0.3 | 46 | 36 |
| Example 603 | 0.7 | 51 | 47 |
| Example 604 | 1.5 | 38 | 37 |
| Example 605 | 10 | 24 | 28 |
| Comparative Example 602 | 25 | 20 | 15 |

TABLE 8

| | Stress of Hard Coating Layer (GPa) | Cutting Test A (minutes) | Cutting Test B (minutes) |
|---|---|---|---|
| Example 701 | +1 | 25 | 12 |
| Example 702 | +0.3 | 31 | 23 |
| Example 703 | −0.1 | 46 | 34 |
| Example 704 | −0.7 | 53 | 46 |
| Example 705 | −1.2 | 38 | 32 |
| Example 706 | −1.6 | 18 | 24 |
| Example 707 | −3 | 10 | 17 |

TABLE 9

| | Thickness of Hard Coating Layer (μm) | Cutting Test A (minutes) | Cutting Test B (minutes) |
|---|---|---|---|
| Example 801 | 0.75 | 24 | 23 |
| Example 802 | 1.6 | 37 | 34 |
| Example 803 | 3.3 | 44 | 40 |
| Example 804 | 6 | 40 | 41 |
| Example 805 | 15 | 31 | 34 |
| Example 806 | 19 | 26 | 30 |
| Example 807 | 28 | 24 | 17 |

TABLE 10

| | Particle Size of Columnar Crystals (nm) | Cutting Test A (minutes) | Cutting Test B (minutes) |
|---|---|---|---|
| Example 901 | 0.5 | 24 | 23 |
| Example 902 | 1.5 | 37 | 32 |
| Example 903 | 3.5 | 50 | 40 |
| Example 904 | 7 | 46 | 33 |
| Example 905 | 13 | 36 | 21 |
| Example 906 | 23 | 25 | 17 |

TABLE 11

| | Cutting Test A (minutes) | Cutting Test B (minutes) |
|---|---|---|
| Example 1001 | 42 | 37 |
| Example 1002 | 45 | 46 |
| Example 1003 | 51 | 37 |
| Comparative Example 1001 | 10 | exfoliated/chipped |

As is apparent from Tables 1 to 11, it can be confirmed that the examples of the present invention obviously provide tools having longer lifetime, when compared with the comparative examples. That is, it can be confirmed that the surface-coated sintered body of the present invention is excellent in adhesion between the sintered body of cubic boron nitride and the surface coating layer, and is excellent in both wear resistance and toughness.

While the embodiments and examples of the present invention have been described above, it is also planned from the outset to combine configurations of the embodiments and examples as appropriate.

It should be understood that the embodiments and examples disclosed herein are illustrative and non-restrictive in every respect. The scope of the present invention is defined by the scope of the claims, rather than the description above, and is intended to include any modifications within the scope and meaning equivalent to the scope of the claims.

The invention claimed is:

1. A surface-coated sintered body, comprising:
   a sintered body of cubic boron nitride; and
   a surface coating layer formed on a surface thereof,
   said sintered body of cubic boron nitride containing 20 to 99.5% by volume of cubic boron nitride and a binder,
   said surface coating layer including an adhesion layer and at least one hard coating layer,
   said adhesion layer being a metal layer containing at least W, and being formed to cover a portion of the surface of said sintered body of cubic boron nitride,
   said hard coating layer being formed to cover said sintered body of cubic boron nitride and said adhesion layer,
   a ratio of cubic boron nitride particles in contact with said adhesion layer to a total number of cubic boron nitride particles in contact with said adhesion layer or said hard coating layer in the surface of said sintered body of cubic boron nitride being 0.01 to 20%.

2. The surface-coated sintered body according to claim 1, wherein said adhesion layer is in an amorphous state or composed of ultrafine particles having an average particle size equal to or smaller than 5 nm.

3. The surface-coated sintered body according to claim 1, wherein said adhesion layer contains W at 0.05 to 95 atomic %.

4. The surface-coated sintered body according to claim 1, wherein said adhesion layer contains one or both of Ti and Cr at an atomic ratio of 0.1 to 3 relative to W.

5. The surface-coated sintered body according to claim 1, wherein said adhesion layer contains at least one element selected from the group consisting of Co, Ni, and Fe, at 0.1 to 20 atomic %.

6. The surface-coated sintered body according to claim 1, wherein said adhesion layer has a thickness of 0.5 to 30 nm.

7. The surface-coated sintered body according to claim 1, wherein said hard coating layer has a stress of −1.5 to +0.5 GPa.

8. The surface-coated sintered body according to claim 1, wherein
   said hard coating layer includes a first coating layer as a lowermost layer in contact with said sintered body of cubic boron nitride and said adhesion layer, and
   said first coating layer is composed of a compound of: at least one element selected from the group consisting of group IVa elements, group Va elements, and group VIa elements in a periodic table of elements, Al, and Si; and at least one element selected from the group consisting of boron, carbon, nitrogen, and oxygen.

9. The surface-coated sintered body according to claim 8, wherein said first coating layer is composed of at least one compound selected from the group consisting of TiAlN, AlCrN, and TiSiN, or a solid solution containing the compound, or composed of a super-multilayer laminate having said compound or said solid solution as a constituent layer.

10. The surface-coated sintered body according to claim 8, wherein said first coating layer has a region within 20 nm from its interface with said adhesion layer, that is composed of columnar crystals having particle sizes of 1 to 20 nm.

11. The surface-coated sintered body according to claim 1, wherein said hard coating layer has a thickness of 0.5 to 20 μm.

12. A cutting tool formed by bonding a surface-coated sintered body as recited in claim 1 to a cutting edge portion of a substrate made of cemented carbide.

* * * * *